United States Patent [19]

Lahitte et al.

[11] Patent Number: 5,384,542
[45] Date of Patent: Jan. 24, 1995

[54] DEVICE FOR ESTIMATING, AT HIGH TEMPERATURE, THE ELECTROMAGNETIC PROPERTIES OF A MATERIAL

[75] Inventors: Pierre V. A. Lahitte, Salaunes; Jean-Yves Bratieres, Merignac; Michel Grenot, Saint Medard en Jalles; Brigitte Prache, Bordeaux, all of France

[73] Assignee: Societe Anonyme dite: Aerospatiale Societe Nationale Industrielle, Paris, France

[21] Appl. No.: 164,615

[22] Filed: Dec. 8, 1993

Related U.S. Application Data

[63] Continuation of Ser. No. 862,294, Apr. 2, 1992, abandoned.

[30] Foreign Application Priority Data

Apr. 19, 1991 [FR] France .................. 91 04851

[51] Int. Cl.⁶ .................................... G01R 27/26
[52] U.S. Cl. .................... 324/642; 324/632; 324/703; 324/603
[58] Field of Search ............. 324/703, 642, 632, 603

[56] References Cited

U.S. PATENT DOCUMENTS

| | | |
|---|---|---|
| 3,693,080 | 9/1972 | Ross . |
| 4,700,127 | 10/1987 | Sasaki .................. 324/633 |
| 4,866,369 | 9/1989 | Guillon . |
| 4,996,498 | 2/1991 | Sinclair . |
| 5,103,182 | 4/1992 | Moslehi .................. 324/637 |
| 5,119,034 | 6/1992 | Ishikawa .................. 324/633 |

FOREIGN PATENT DOCUMENTS 0307261 3/1989 European Pat. Off. .
0418117A1 3/1991 European Pat. Off. .

OTHER PUBLICATIONS

AFSAR: "The Measurement of the Properties of Materials"-PiEEE -Jan. 1986, pp. 183-199.
Kwok: "Time-Domain Measurements for Determination of Dielectric Properties of Agricultural Materials'-'-IEEE Trans. on Intr. & Mecs. -Jun. 1979.
Maze et al., *Microwave Journal*, vol. 33, No. 10, Oct. 1990, pp. 77-88.
Buckmaster et al., *IEEE Instrumentation and Measurement Technology Conference*, Feb. 13-15, 1990, San Jose, Calif., pp. 115-118.

*Primary Examiner*—Kenneth A. Wieder
*Assistant Examiner*—Jose M. Solis
*Attorney, Agent, or Firm*—Marshall, O'Toole, Gerstein, Murray & Borun

[57] ABSTRACT

Device for estimating, at high temperature, the electromagnetic properties of a material, including:

an oven (1, 19, 20);

a waveguide (3) disposed at least in part in said oven, a housing for a specimen piece of uniform thickness made of said material, this specimen piece being such that, when it is disposed in said housing, its outer periphery matches the inner surface of the waveguide;

means (4, 5, 6) for applying an incident very high frequency electromagnetic wave to the waveguide (3); and means (4, 5, 6) for collecting the electromagnetic wave reflected by said specimen piece.

A vertically disposed waveguide has (3) said housing provided at the open lower end (3B).

15 Claims, 5 Drawing Sheets

FIG_1
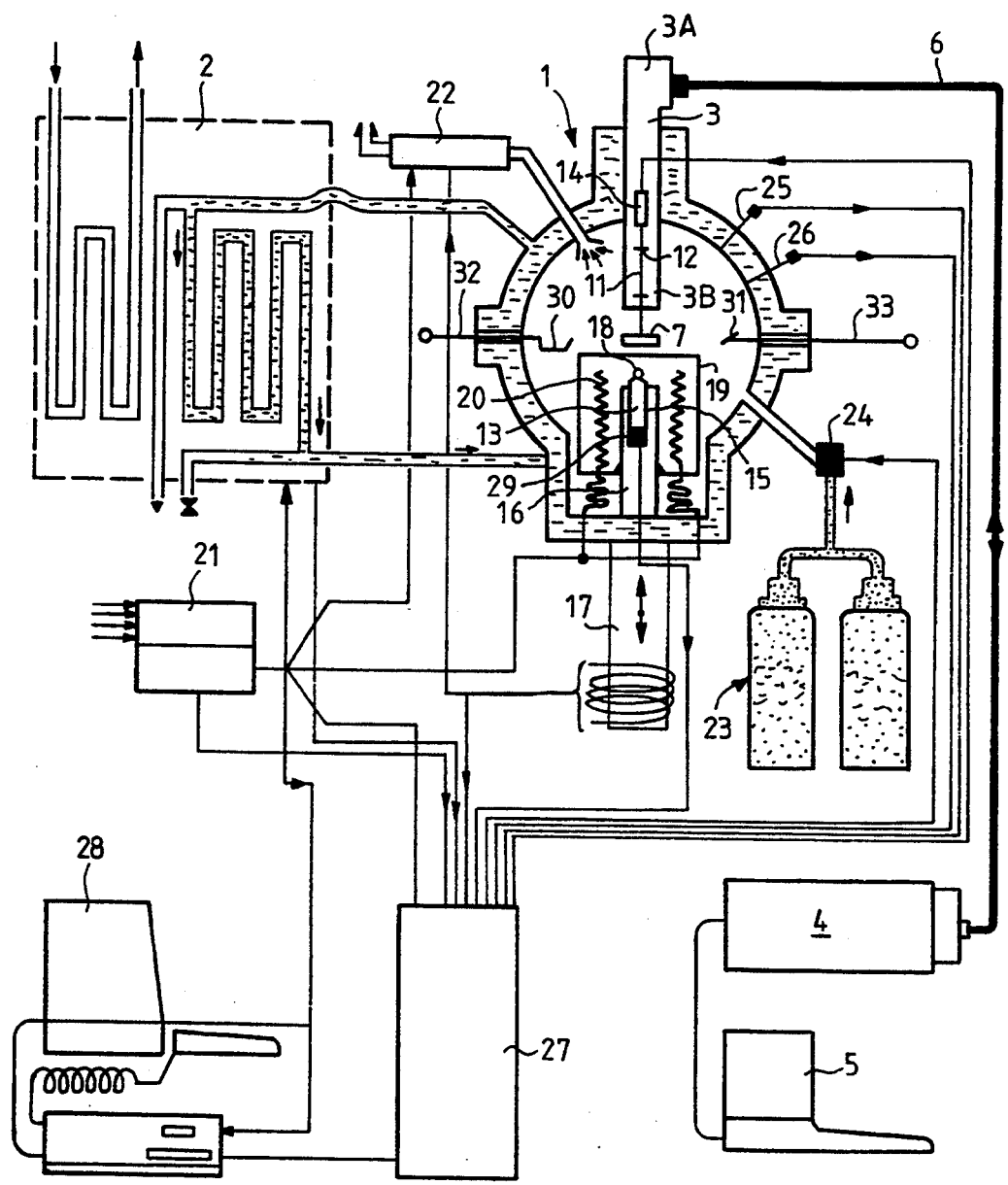

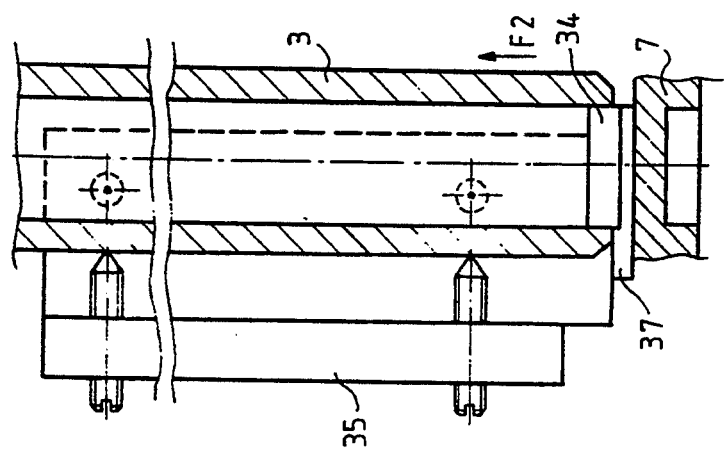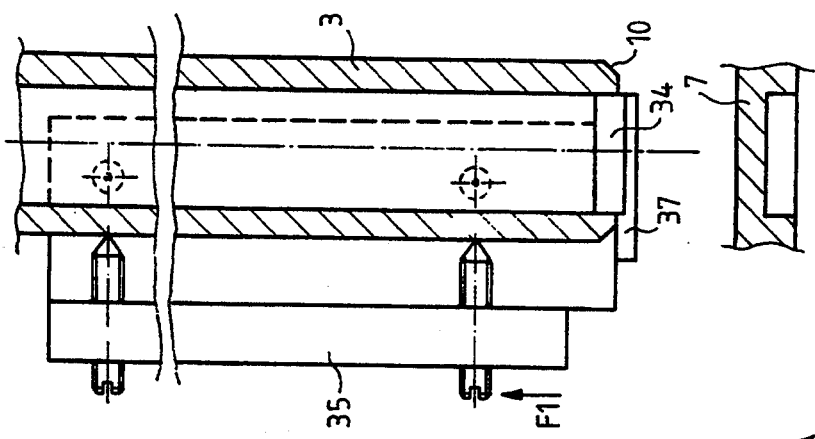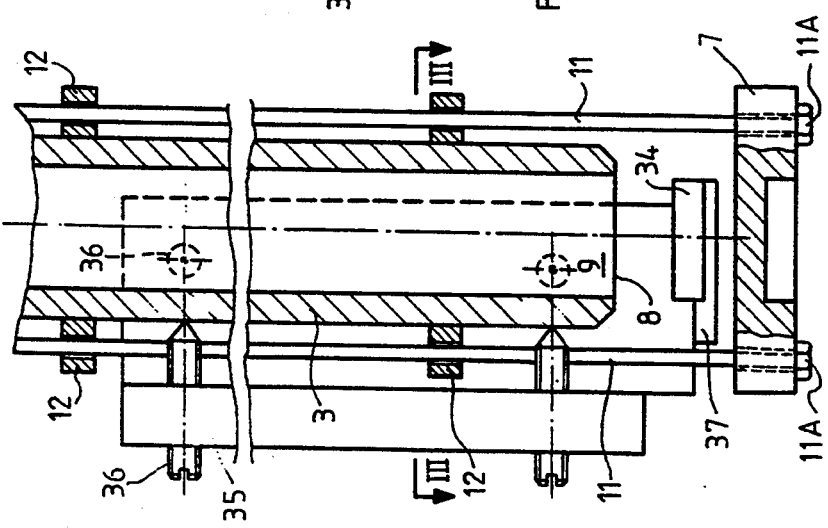

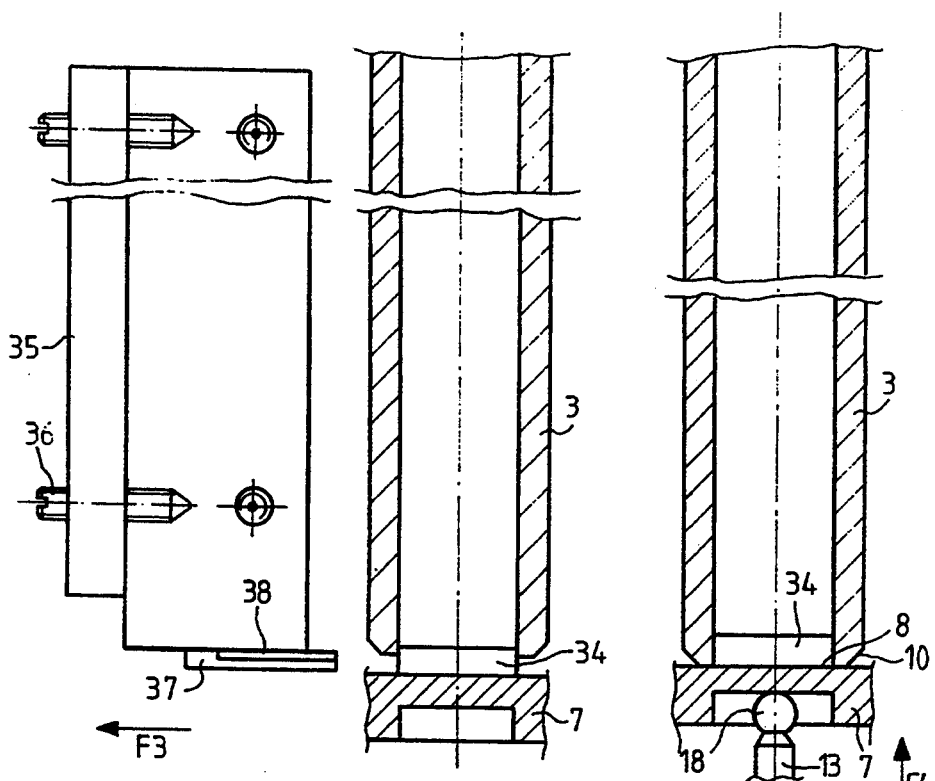
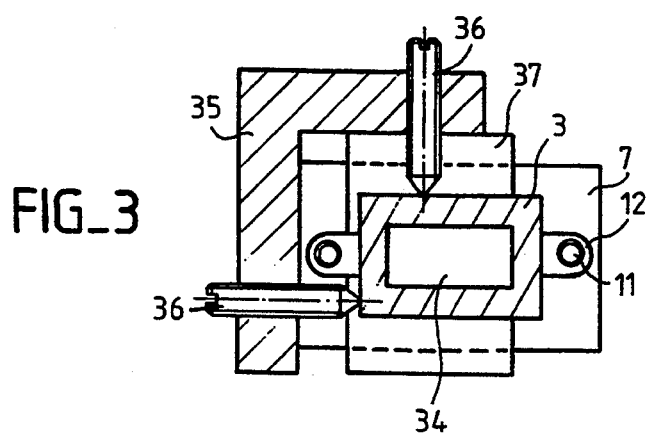

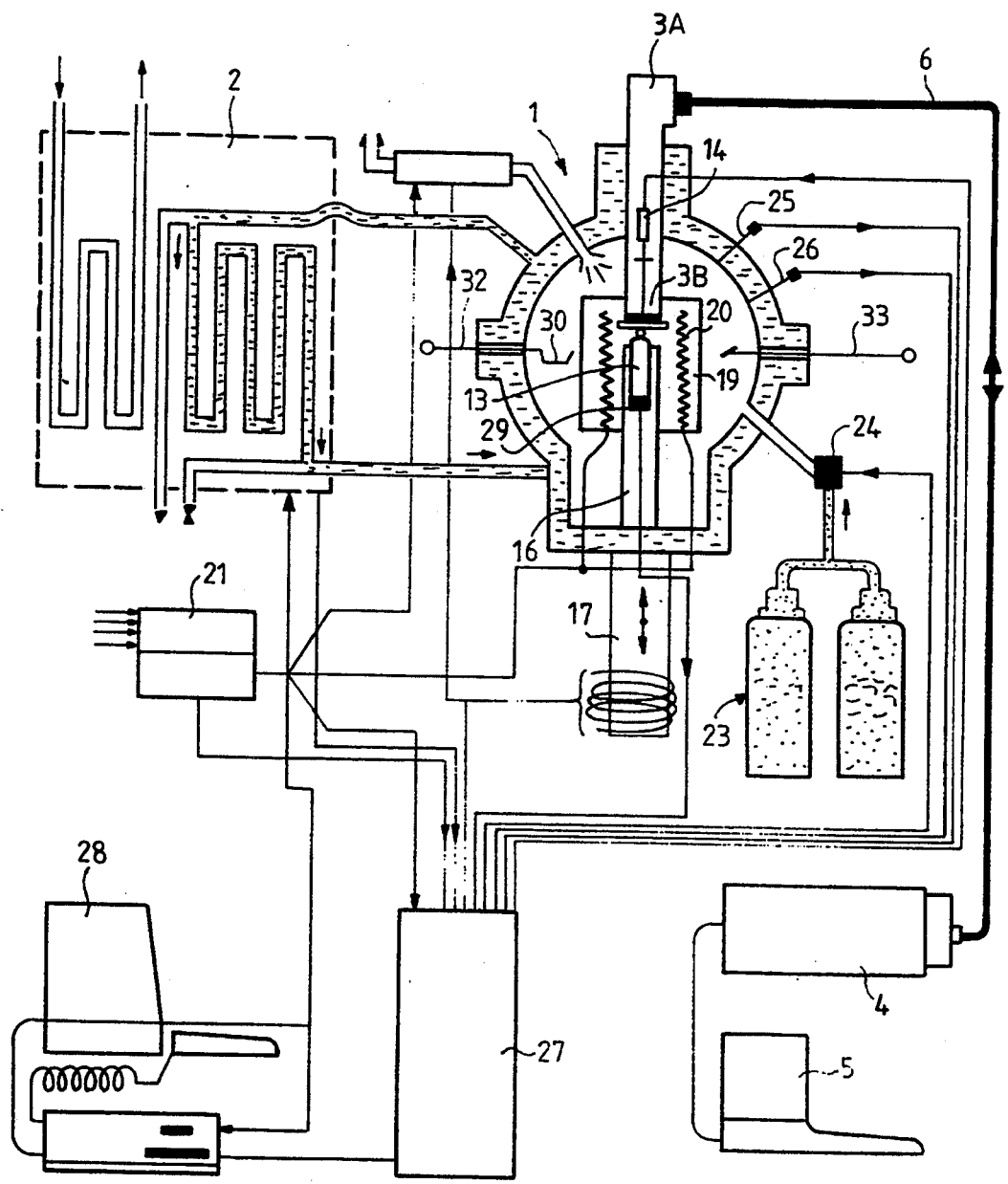
FIG_4

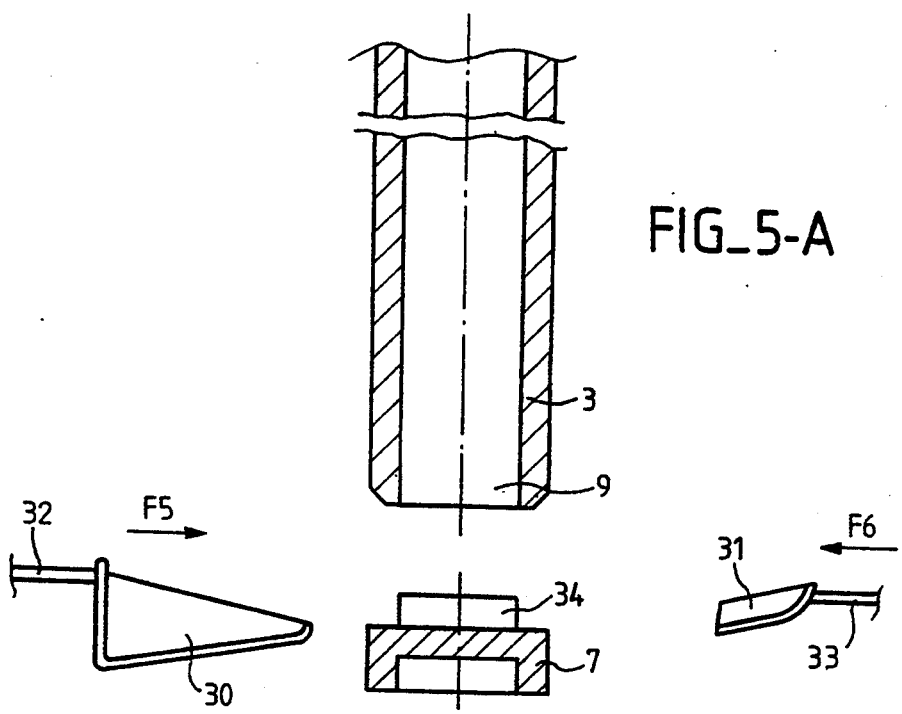
FIG_5-A
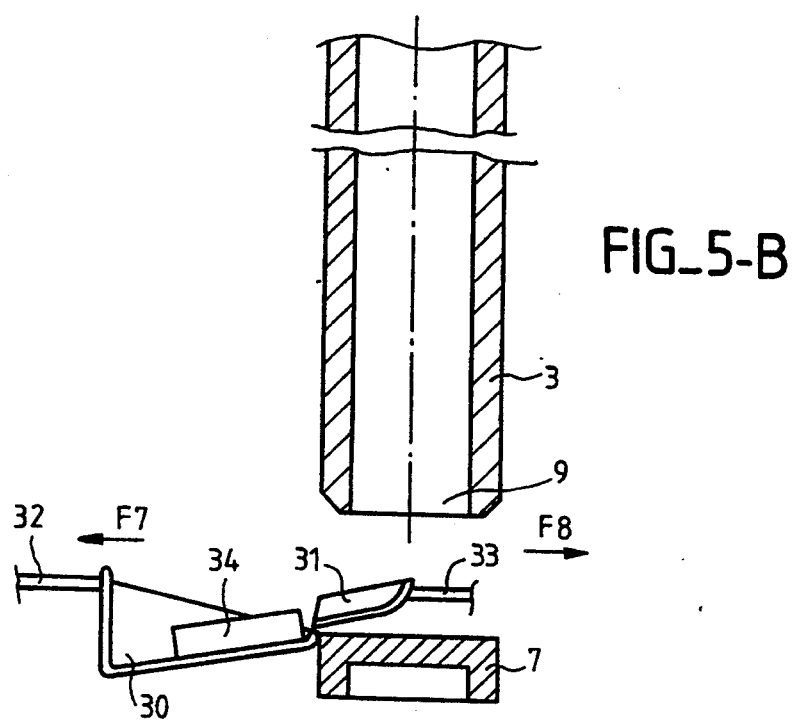
FIG_5-B

DEVICE FOR ESTIMATING, AT HIGH TEMPERATURE, THE ELECTROMAGNETIC PROPERTIES OF A MATERIAL

This is a continuation of U.S. application Ser. No. 07/862,294, filed Apr. 2, 1992, now abandoned.

The present invention relates to a device for estimating, at high temperature, the electromagnetic properties of a dielectric or magnetic material, essentially its relative permittivity and/or its relative permeability.

The understanding of these electromagnetic properties is particularly important in the aeronautical or space fields, as such properties determine the electromagnetic behavior of the material. For example, such understanding enables the radar response of an aircraft or the transmission of signals through the fuselage to be assessed. Thus, in order to characterize the electromagnetic behavior of such a material, it is necessary to know said electromagnetic properties.

A method is known, for example by the document ALTA FREQUENZA, vol. 36, No. 8, August 1967, pages 757-764, Milan, It; G. FRANCESCHETTI: "A complete analysis of the reflection and transmission methods for measuring the complex permeability and permittivity of materials at microwaves", for determining the electromagnetic properties of a material using specimens of the latter introduced into an electromagnetic apparatus such as a coaxial line or a waveguide. The measurements may be carried out at ambient temperature or alternatively at high temperature (up to 2000° C.), as is indicated in the document MICROWAVE JOURNAL, February 1991, pages 67 and following; Rick L. MOORE, Anita MACDONALD and H. Ross MOROZ: "Permittivity of Fiber-Polymer Composites: A study to determine the effects of the environment".

In the case where the measurements are carried out at high temperature, it is necessary to dispose said electromagnetic apparatus in an oven. As a result of this, there are then difficulties with loading and with unloading the specimens of said material in said electromagnetic apparatus.

The subject of the present invention is a device for estimating, at high temperature, the properties of a dielectric or magnetic material, enabling said specimens to be loaded and unloaded easily.

For this purpose, according to the invention, the device for estimating, at high temperature, the electromagnetic properties of a material, comprising:
  an oven;
  an electromagnetic measurement apparatus, disposed at least in part in said oven and comprising, in this latter part, a housing for a specimen piece of uniform thickness made in said material, this specimen piece being such that, when it is disposed in said housing, its outer periphery matches the inner surface of said electromagnetic measurement apparatus;
  means for applying an incident very high frequency electromagnetic wave to said electromagnetic measurement apparatus; and
  means for collecting the electromagnetic wave transmitted by said specimen piece;
is remarkable in that said electromagnetic measurement apparatus is a vertically disposed waveguide and in that said housing is provided at the open lower end of said waveguide.

Thus, it is possible to introduce said specimen piece into the waveguide by a simple upward movement and to extract it therefrom by allowing it to fall under its own weight. Such a natural extraction is permitted by the fact that the expansion of the waveguide (constructed from a metal such as molybdenum or tungsten) is generally greater than that of the specimen piece whose electromagnetic properties are being measured. Where appropriate, in the measurement of the latter, a corrective term is applied which takes into account the clearance appearing between the outline of said specimen piece and the internal wall of said waveguide. It will be noticed that, since the electromagnetic apparatus is a waveguide—therefore a hollow tubular jacket—, the installation and extraction of the specimen piece are facilitated, since no central core exists, as would be the case with a coaxial line. Also as a result of the choice of a waveguide as electromagnetic apparatus, the distribution of heat in the specimen piece is particularly good and uniform, and better than that which would be obtained with a coaxial line whose central core disturbs such a heat distribution thereby rendering it non-uniform within said specimen piece.

The device according to the invention preferably comprises in addition an electromagnetically conductive small plate which is applied against the open lower end of said waveguide and is capable of supporting said specimen piece during the measurements. Thus, said small plate forms a short-circuit for said waveguide.

In order that the measurements are as accurate as possible, the open lower end of the waveguide is bevelled on the outside. Thus, the contact surface between the waveguide and said small plate is reduced and the application of the latter against the waveguide is improved.

Advantageously, said small plate is guided so as to slide vertically in relation to the waveguide. It is of advantage for such a sliding to be carried out under the action of a thrust device or the like.

In order to install the specimen piece in its housing, it is of advantage to provide means which temporarily support said specimen piece and which are centered in relation to the outer surface of said waveguide. Thus, it is possible to easily introduce said specimen piece into its housing, said small plate being raised into a position close to the position for closing off said waveguide, to remove said support means thereby depositing said specimen piece on said small plate, the latter remaining engaged in its housing.

In order to avoid any contamination of the specimen piece during the measurements, there is provision for an electrical-type oven enabling in addition a wide range of temperatures to be obtained. This oven may, according to one particular feature of the invention, comprise a thermal enclosure enclosing a heating jacket, movable vertically between a retracted position, in which it is clear of the lower end of said waveguide in order to enable the specimen piece to be installed and extracted, and a projecting position, in which it surrounds said lower end of said waveguide. This projecting position corresponds especially to the heating position, such that the specimen piece is then surrounded by said heating jacket, which permits particularly effective and uniform heating. In order to move said heating jacket vertically, there is provision for driving means, such as a thrust device or the like. It is of advantage that said driving means, during the measurements, press said small plate against the lower end of said waveguide.

The pressure of said driving means on said small plate is preferably exerted by the agency of a vertically movable rod associated with a pressure sensor. Thus, during the measurement, the pressure of the small plate against the waveguide may be kept constant, although the deformability of the waveguide varies with temperature. By virtue of such a particular feature, the accuracy of the measurements is further improved.

In order to further increase the uniformity of the distribution of the pressure exerted by the small plate against the open end of the waveguide, said rod presses said small plate by the agency of a ball which bears approximately at the center of said small plate.

According to yet another particular feature of the present invention, there is provision for a scoop and pusher system which can be activated from outside the oven and which enables the specimen piece to be removed from said small plate, when the latter is away from said waveguide. This particular feature permits a particularly advantageous mode of operation of the device in accordance with the invention. It is known in fact that the measurements of electromagnetic properties of a specimen piece require identical measurements, blank (without said specimen piece) and with said specimen piece, said properties being deduced from the comparison of said measurements. By virtue of the scoop and pusher system and by starting with the measurements relating to the specimen, it is possible to carry out the blank measurements without opening the oven and without having to restart a temperature-rise cycle. Thus, with a single temperature-rise cycle it is possible to carry out the measurements relating to the specimen piece and then the blank measurements. The total time for the measurements is therefore considerably shortened.

In a known fashion, the device may also comprise auxiliary apparatuses and detectors such as:
- vacuum pump for producing the vacuum inside said oven and so reducing the contamination of the specimen piece;
- storage containers of neutral gas in order to flush the oven;
- device for cooling the enclosure of the oven;
- temperature sensor;
- vacuum gauge etc.

In order to control these various auxiliary apparatuses and detectors, as well as the thrust device for vertically sliding the small plate and said driving means, it is of advantage to provide a first computer. A second computer may be provided in order to actuate said electromagnetic apparatus and to carry out the measurements relating to the latter.

The figures of the attached drawing will make it better understood how the invention may be realized. In these figures, the same references designate like elements.

BRIEF DESCRIPTION OF THE DRAWINGS

FIG. 1 is a schematic diagram, in the rest position, of the device in accordance with the present invention, the oven therein being shown in cross section.

FIGS. 2A to 2E are vertical cross sections of the lower end of the waveguide, illustrating the installing of a specimen piece into said waveguide, in a plane perpendicular to that of FIG. 1.

FIG. 3 is a horizontal cross section along the line III—III of FIG. 2A.

FIG. 4 is a schematic diagram similar to that of FIG. 1, the oven being in a heating phase.

FIGS. 5A and 5B are vertical cross sections of the lower end of the waveguide, illustrating the removal of said specimen piece, the plane of FIGS. 5A and 5B being perpendicular to that of FIGS. 2A to 2E.

The device in accordance with the present invention, shown diagrammatically in FIG. 1, comprises a double-walled thermal enclosure 1 coursed by a cooling fluid traversing a cooling system 2. At the upper part of the thermal enclosure 1 is disposed a vertical waveguide 3 traversing said enclosure in a sealed manner. The upper part 3A of said waveguide, outside the thermal enclosure 1, is connected to a network analyzer 4 and to a computer 5 via a coaxial cable 6. The assembly 4-5-6 forms the device for supplying the waveguide 3 with electromagnetic waves and the device for analyzing the electromagnetic waves coursing said waveguide 3.

The lower part 3B of the waveguide 3, which is inside the thermal enclosure 1, is open and may be closed off by a small plate 7, which is capable of being applied against the edges 8 of the lower opening 9 of the waveguide 3 (see FIG. 2E). In order to ensure the uniformity of the contact between the small plate 7 and the edges 8 of the opening 9, these edges are bevelled on the outside (at 10).

The waveguide 3 may, for example, be constructed from molybdenum or tungsten sheet. In the figures, the waveguide 3 is shown with a rectangular cross section.

As is shown in more detail in FIGS. 2A and 2E (the plane of which is perpendicular to the plane of FIG. 1), the small plate 7 is suspended on rods 11 in relation to which it may slide, said rods 11 themselves sliding in slide bearings 12 which are fixed to the outer wall of the waveguide 3. The small plate 7, held on the rods 11 by stops 11A, is capable of being pushed upwards by a rod 13 by sliding along said rods 11 in order to be applied against the lower opening 9 of the waveguide.

The suspension rods 11 can slide in the slide bearings 12 under the action of a thrust device 14, for example of pneumatic type. The support rod 13 is housed, in the manner of a piston, in a cylinder 15 provided at the end of the piston rod 16 of a thrust device 17, for example of electrical type. The thrust device 17 is disposed at the lower part of the thermal enclosure 1, outside the latter. Its rod 16 traverses said enclosure in a sealed manner and is disposed vertically, opposite the waveguide 3.

The rod 13 is capable of bearing beneath the small plate 7, in the vicinity of its center, by the agency of a ball 18. Thus, the uniformity of the contact between the small plate 7 and the edges 8 of the opening 9 may be further improved, by taking advantage of the inevitable play of the rods 11 in the bearings 12 and in the small plate 7.

Fixed to the rod 16 of the thrust device 17 is a coaxial cylindrical jacket 19 whose wall carries electrical resistance elements 20.

The device of FIG. 1 also comprises:
- an electrical supply 21;
- a pumping device 22 for producing the vacuum in the enclosure 1;
- a device 23 for introducing a neutral gas into the enclosure 1, by the agency of a solenoid valve 24;
- a vacuum gauge 25 and a thermocouple 26 for measuring the vacuum and the temperature inside the enclosure 1; and
- an oven actuation and control unit 27 controlled by a computer 28.

Moreover, a pressure detector 29 is disposed between the bottom of the cylinder 15 and the rod 13, whereas a scoop 30 and a pusher 31 are respectively solidly connected to actuating rods 32 and 33 which traverse the enclosure 1 in a sealed manner.

In the initial phase of a measurement cycle, the device in accordance with the invention is in the state shown in FIG. 1, that is to say that:

the small plate 7 is away from the lower end 3B of the waveguide 3 and suspended from the latter by the rods 11 and the stops 11A;

the rod 16 of the thrust device 17 is retracted, such that the small plate 7 is outside the jacket 19, and above the latter;

the scoop 30 and pusher 31 system is retracted laterally.

In this initial state, the lower opening 9 of the waveguide 3 is therefore clear and it is possible to introduce therein a specimen piece 34 of the material to be studied, in the manner illustrated by FIGS. 2A to 2E and 3. The plane of FIGS. 2A to 2E is perpendicular to that of FIG. 1 and, in order to simplify the drawing, the rods 11 and the bearings 12 have not been shown in FIGS. 2B to 2E.

In order to instal the specimen piece 34 into the opening 9 which is provided at the lower part of the waveguide 3, the enclosure 1 being open, a right-angle plate 35 is used which is capable of bearing on two consecutive outer faces of said waveguide 3, for example by the agency of adjustment screws 36. At the lower part of said right-angle plate 35, the dihedral of the latter is partly closed off by a thin strip 37 comprising the recess 38 for the specimen piece 34.

Thus, the specimen piece 34 can be accurately disposed on the thin strip 37 by virtue of the recess 38 and said thin strip 37 can be accurately disposed between the lower opening 9 of the waveguide 3 and the small plate 7 by virtue of the adjustment screws 36.

As is shown in FIG. 2A, by virtue of the right-angle plate 35 and of the thin strip 37, the specimen piece 34 can be disposed just opposite the lower opening 9, but above the small plate 7.

Consequently, by sliding (arrow F1) the right-angle plate 35 upwards whilst keeping the contact between the latter and the outer wall of the waveguide 3, it is possible to introduce the specimen piece 34 accurately inside the lower opening 9 of the waveguide 3 until the thin strip 37 bears against the edge 8 of said opening 9 (FIG. 2B). In this position, the thrust device 14 is actuated in order for it to pull the rods 11 upwards (arrow F2) until the small plate 7 arrives just below the thin strip 37, without pressing it (FIG. 2C). It is then possible to withdraw the right-angle plate 35 and the thin strip 37 laterally (arrow F3), the specimen piece 34 remaining inside the opening 9 but now resting on the small plate 7 (FIG. 2D). Finally, the thrust device 17 is activated, such that its rod 16 is moved vertically upwards (arrow F4) bringing with it in its upward movement the rod 13 and such that the ball 18 presses the small plate 7 against the edge 8 of the opening 9 (FIG. 2E). As the rod 16 is raised, the heating jacket 19, solidly connected to the latter, has been positioned around the lower end 3B of the waveguide 3 (FIG. 4).

After having closed the enclosure 1 again, it is then possible to evacuate and to increase the temperature of the enclosure 1, in a known manner and under the control of the computer 28 and the control unit 27. Having reached and maintained the desired measurement temperature, the measurements concerning the specimen piece 34 are then carried out, under the control of the computer 5 and the analyzer 4.

It will be noticed that, by virtue of the pressure detector 29, it is possible to slave the thrust device 17 in order for the pressure exerted by the small plate 7 on the lower edge 8 of the waveguide 3 to be constant.

When the necessary measurements have been carried out, without opening the enclosure 1, the thrust device 17, and then the thrust device 14, are actuated for lowering. Consequently, the heating jacket 19 and the small plate 7 are lowered; the specimen piece 34 leaves the opening 9 of the waveguide whilst remaining supported by said small plate 7. When the latter reaches a predetermined level, the scoop 30 and pusher 31 system is activated by the rods 32 and 33 in order to move closer (arrows F5 and F6) to the specimen piece 34 (FIG. 5A). With the closing movement continuing, the pusher 31 can eject the specimen piece 34 into the scoop 30 (FIG. 5B). By actuating the rods 32 and 33 in the reverse direction (arrows F7 and F8), it is possible to retract the scoop 30 and the pusher 31 laterally, in order to clear the central part of the enclosure 1 once again.

The thrust devices 14 and 17 are then reactuated for raising, in order to take up the relative positions of FIGS. 2E and 4 again, but without the specimen piece 34. It is then possible to carry out the blank measurements from which it will be possible to determine, by comparison with the previous measurements, the electromagnetic properties of the material of the specimen piece 34.

In the description hereinabove, there has only been described that which relates to the present invention, and no detail has been provided on the operating of the vacuum pump 22, of the neutral-gas flushing device 23, 24 and of the heating and temperature-regulating device, which is known by the person skilled in the art.

We claim:

1. A device for estimating, at high temperature, the electromagnetic properties of a material, comprising:

an oven (1, 19, 20);

an electromagnetic measurement apparatus (3), disposed at least in part in said oven and comprising, within said oven, a housing (9) for a specimen piece (34) of uniform thickness made of said material, said specimen piece (34) being such that, when it is disposed in said housing (9), its outer periphery matches the inner surface of said electromagnetic measurement apparatus;

means (4, 5, 6) for applying an incident very high frequency electromagnetic wave to said electromagnetic measurement apparatus (3); and means (4, 5, 6) for collecting the electromagnetic wave transmitted by said specimen piece (34);

wherein said electromagnetic measurement apparatus is a metallic hollow tubular vertically disposed waveguide (3) and said housing (9) is provided at the open lower end (3B) of said waveguide (3), and wherein the thermal expansion of the metal of said waveguide (3) is greater than that of said material of said specimen piece (34).

2. The device as claimed in claim 1, which comprises an electromagnetically conductive small plate (7) which is applied against the open lower end of said waveguide (3) and is capable of supporting said specimen piece (34) during the measurements.

3. The device as claimed in claim 2, wherein the open lower end of said waveguide is bevelled on the outside (at 10).

4. The device as claimed in claim 2, wherein said small plate (7) is guided so as to slide vertically (11, 12) in relation to the waveguide (3).

5. The device as claimed in claim 4, wherein said vertical sliding of the small plate (7) is carried out under the action of a thrust device (14).

6. The device as claimed in claim 1, which comprises means (35, 36, 37) which temporarily support said specimen piece (34) and which are centered in relation to the outer surface of said waveguide (3).

7. The device as claimed in claim 1, wherein said oven is of electrical type.

8. The device as claimed in claim 7, wherein said oven comprises a thermal enclosure (1) enclosing a heating jacket (19, 20), movable vertically between a retracted position, in which it is clear of the lower end of said waveguide (3) in order to enable said specimen piece (34) to be installed and extracted, and a projecting position, in which it surrounds said lower end of said waveguide.

9. The device as claimed in claim 8, which comprises driving means (16, 17) in order to move said heating jacket (19, 20) vertically.

10. The device as claimed in claim 9, wherein said driving means (16, 17), during the measurements, press said small plate (7) against the lower end of said waveguide (3).

11. The device as claimed in claim 10, wherein the pressure of said driving means (16, 17) on said small plate (7) is exerted by the agency of a vertically movable rod (13) associated with a pressure sensor.

12. The device as claimed in claim 11, wherein said rod (13) presses said small plate (7) by the agency of a ball (18) which bears approximately at the center of said small plate (7).

13. The device as claimed in claim 2, which comprises a scoop (30) and pusher (31) system which can be activated from outside the oven and which enables the specimen piece (34) to be removed from said small plate when the latter is away from said waveguide.

14. The device as claimed in claim 5, comprising auxiliary apparatuses and detectors (2, 22, 23, 24, 25, 26), which comprises computing means (27) in order to control said auxiliary apparatuses and detectors as well as said thrust device (14) and said driving means (16, 17).

15. The device as claimed in claim 1, which comprises computing means (4, 5) in order to control said electromagnetic apparatus (3).

* * * * *